(12) United States Patent
Ando et al.

(10) Patent No.: US 11,075,338 B2
(45) Date of Patent: Jul. 27, 2021

(54) RESISTIVE MEMORY CELL STRUCTURE

(71) Applicant: International Business Machines Corporation, Armonk, NY (US)

(72) Inventors: Takashi Ando, Tuckahoe, NY (US); Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 16/421,598

(22) Filed: May 24, 2019

(65) Prior Publication Data

US 2020/0373482 A1 Nov. 26, 2020

(51) Int. Cl.
*H01L 45/00* (2006.01)
*H01L 27/24* (2006.01)
*H03K 19/1776* (2020.01)

(52) U.S. Cl.
CPC ...... *H01L 45/1206* (2013.01); *H01L 27/2436* (2013.01); *H01L 27/2463* (2013.01); *H01L 45/1253* (2013.01); *H01L 45/146* (2013.01); *H01L 45/1616* (2013.01); *H03K 19/1776* (2013.01)

(58) Field of Classification Search
CPC ... H01L 45/08; H01L 45/1206; H01L 45/124; H01L 45/1253; H01L 45/145; H01L 45/146; H01L 45/1616; H01L 27/2436; H01L 27/2463; H01L 45/1608; H01L 45/1683; G11C 11/5686; H03K 19/1776
See application file for complete search history.

(56) References Cited

U.S. PATENT DOCUMENTS

| | | | |
|---|---|---|---|
| 8,451,646 B2 | 5/2013 | Chi et al. | |
| 8,981,328 B2 | 3/2015 | Greene et al. | |
| 9,627,441 B2 | 4/2017 | Van Buskirk | |
| 10,056,907 B1 | 8/2018 | Asnaashari et al. | |

(Continued)

OTHER PUBLICATIONS

Clermidy et al., "Resistive Memories: Which Applications?", 6 pages, © 2014 EDAA.

(Continued)

*Primary Examiner* — Selim U Ahmed
(74) *Attorney, Agent, or Firm* — David K. Mattheis; William H. Hartwell; Nicholas L. Cadmus

(57) ABSTRACT

Resistive random-access memory cell structures including a first and second resistive random-access memory element stacks, each including an anode and a cathode; a pass transistor having first and second source/drain terminals, and a gate terminal. The gate terminal is connected to the anodes of the first and second resistive random-access memory element stacks. An isolation layer is disposed upon the gate terminal. The isolation layer includes at least two vias, each defined by a perimeter extending from a top surface of the isolation layer to a bottom surface of the isolation layer, each perimeter exposes a portion of the gate. The first and second resistive random-access memory element stacks include a bottom electrode, a switching layer, a top electrode and a low-resistance film. The gate is the bottom electrode. The switching layer, top electrode and low resistance film are disposed in the vias.

14 Claims, 11 Drawing Sheets

(56) References Cited

U.S. PATENT DOCUMENTS

| | | | |
|---|---|---|---|
| 10,074,692 | B2 | 9/2018 | Hsu et al. |
| 10,121,540 | B1 | 11/2018 | Jo |
| 10,157,962 | B2 | 12/2018 | Chen et al. |
| 10,497,867 | B1* | 12/2019 | Trinh ............... H01L 45/141 |
| 2008/0247219 | A1* | 10/2008 | Choi ............... H01L 27/2409 365/148 |
| 2009/0236581 | A1* | 9/2009 | Yoshida ............. H01L 45/04 257/2 |
| 2012/0104344 | A1* | 5/2012 | Kakehashi ......... H01L 45/1266 257/3 |
| 2016/0351623 | A1* | 12/2016 | Chen ............... H01L 45/1233 |

OTHER PUBLICATIONS

Molas et al., "Functionality and reliability of resistive RAM (RRAM) for non-volatile memory applications", VLSI Technology, Systems and Application (VLSI-TSA), 2016 International Symposium on, 2 pages, © 2016 IEEE.

Onkaraiah et al., "A Hybrid CBRAM/CMOS Look-Up-Table structure for improving performance efficiency of Field-Programmable-Gate-Array", pp. 2440-2443, © 2013 IEEE.

Palma et al., "Interface Engineering of Ag—GeS2-Based Conductive Bridge RAM for Reconfigurable Logic Applications", IEEE Transactions on Electron Devices, vol. 61, No. 3, Mar. 2014, pp. 793-800.

Tonsson et al., "1T2R: A Novel Memory Cell Design to Resolve Single-Event Upset in RRAM Arrays", ASIC (ASICON), 2017 IEEE 12th International Conference on, pp. 12-15, © 2017 IEEE.

Turkyilmaz, O., "Emerging 3D Technologies for Efficient Implementation of FPGAs", Doctoral dissertation, Universite De Grenoble, Nov. 28, 2014, 211 pages.

Vianello et al., "Resistive Memories for Ultra-Low-Power embedded computing design", pp. 6.3.1-6.3.4, © 2014 IEEE.

Yasuda et al., "Nonvolatile Configuration Memory Cell for Low Power Field Programmable Gate Array", 4 pages, © 2011 IEEE.

* cited by examiner

RESISTIVE MEMORY CELL STRUCTURE

BACKGROUND

The disclosure relates generally to resistive random-access memory cell structures. The disclosure relates particularly to resistive random-access memory cell structures of a single transistor and two resistive memory stack elements.

Conventional random-access memory (RAM) cells utilize 6 transistors per cell and are based upon the retention of device charge states. The number of necessary cell elements limits the memory cell density of field programmable gate arrays (FPGAs) using the cells. Though RAM exhibits data remanence, it is still volatile as data is eventually lost when the memory is powered off. The charge-based nature of RAM also makes it subject to data loss from radiation effects. Non-volatile 1 transistor, 2 resistive random-access (RRAM), (1T2R), memory cells using 2 RRAMs as the memory elements require only 3 elements per cell and are not subject to volatility due to power loss or radiation.

SUMMARY

Aspects of the invention disclose resistive random-access memory structures as well as components and systems utilizing the memory cell structures. The resistive random-access memory cell structures include: first and second resistive random-access memory element stacks, each stack including an anode and a cathode; a pass transistor having first and second source/drain terminals, and a gate terminal. The gate terminal is connected to the anodes of the first and second resistive random-access memory element stacks. An isolation layer is disposed upon the gate terminal. The isolation layer includes at least two vias, each via defined by a perimeter extending from a top surface of the isolation layer to a bottom surface of the isolation layer, each perimeter exposes a portion of the gate. The first and second resistive random-access memory element stacks include a bottom electrode, a switching layer, a top electrode and a low-resistance film. The gate is the bottom electrode. The switching layer, top electrode and low resistance film are disposed in the vias.

BRIEF DESCRIPTION OF THE DRAWINGS

FIG. 4 illustrates an exemplary semiconductor substrate, according to an embodiment of the invention.

FIG. 5 illustrates shallow trench isolation regions formed in the substrate, according to an embodiment of the invention.

FIG. 6 illustrates a transistor structure including dummy gate and a first interleaved dielectric layer, according to an embodiment of the invention.

FIG. 7 illustrates removal of the dummy gate structure, according to an embodiment of the invention.

FIG. 8 illustrates metal gate filling, according to an embodiment of the invention.

FIG. 9 illustrates a second interleaved dielectric layer and RRAM vias, according to an embodiment of the invention.

FIG. 10 illustrates formed RRAM stacks, according to an embodiment of the invention.

FIG. 10a shows a cross-sectional view of the structure of FIG. 10 along section line 10a-10a.

DETAILED DESCRIPTION

Figure 1:
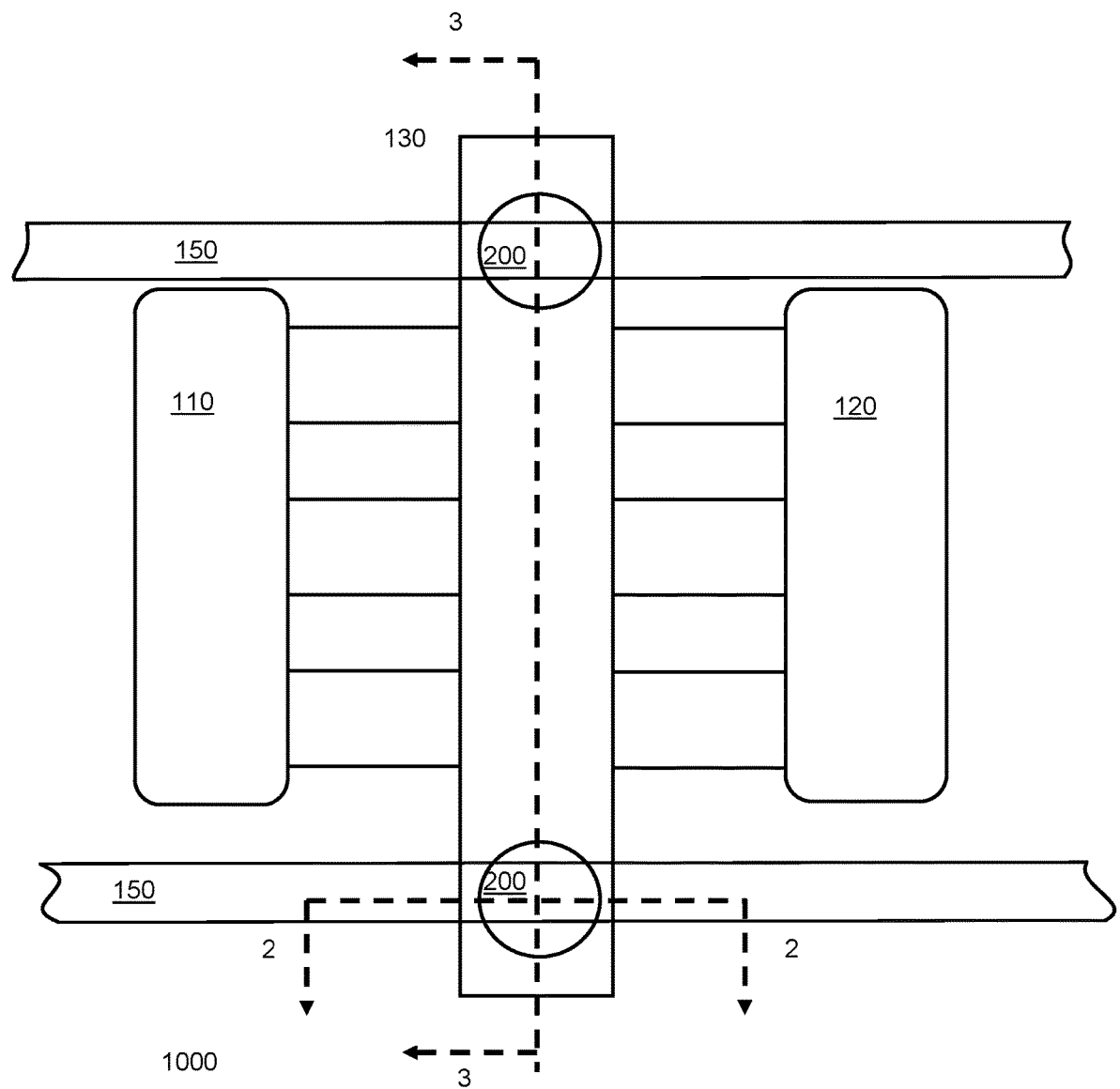
FIG. 1 provides a schematic illustration of a memory cell structure, according to an embodiment of the invention.

A 1T2R resistive random-access memory cell structure requires area for three elements, 1 transistor, and 2 resistive RAM elements. Integrated circuit designs can be limited by die size and the area required for the elements of the circuit. Reducing the area needed for memory elements offers circuit designers a way to increase the element density of the circuits. Increased element density provides the possibility of increased circuit performances in terms of capacity and speed.

In an embodiment, a 1T2R element comprises a standard transistor having source and drain terminals as well as a gate terminal, together with two RRAM element stacks. The memory cell structures may be incorporated as memory elements in any integrated circuit including FPGAs. Each of the stacks comprises an anode and a cathode. In this embodiment, the anodes of both RRAM structures are connected to the gate terminal of the transistor. In this embodiment, after the formation of the transistor on a substrate, a dielectric isolation layer is formed over the transistor. The gate terminal of the transistor can be a high-k dielectric layer in conjunction with a metal material forming a HK/MG (high-k/metal gate) stack element. Vias are formed in the isolation layer over non-active portions of the gate terminal, and the vias are defined by perimeters and expose portions of the gate terminal upper surface. The RRAM element stacks are located in the vias through the sequential deposition of material layers. A first switching layer, such as a metal oxide layer (e.g., $HfO_x$, $TiO_x$, or $TaO_x$), is deposited forming a film in contact with the perimeter of the vias, including in contact with the upper surface of the gate terminal at the bottom of each via. A top electrode layer, such as TiN, or TiAlC/TiN alloy, is deposited as a film over the metal oxide layer. A low-resistance film, such as W, Cu, Ag, or Au, is subsequently deposited over the top electrode layer. Planarization of the completed structure removes the three film layers from the surface of the isolation layer leaving the RRAM element stacks in the vias. Metal traces may be deposited upon the structure as separate power rails for each of the RRAM element stacks.

In an embodiment, a barrier layer such as TaN may deposited between the top electrode layer and the low-resistance film. The barrier layer prevents interactions between the RRAM stack and the low-resistance film and stabilizes the resistant states of the element.

In an embodiment, writing to the memory cells includes applying a supply voltage ($V_{dd}$) to a terminal connected to one of the RRAM element stacks and applying a ground voltage ($V_{ss}$) to a terminal connected to the other RRAM element stacks to write a "0" value to the cell structure with one RRAM set to a high resistance and the other set to a low resistance. To program a "1" value to the cell structure, the resistance states of the two RRAM elements are flipped. The voltage at the gate terminal switches between $V_{dd}$ and $V_{ss}$ depending on the states of the two RRAM elements, which controls the on/off state of the pass transistor.

FIG. 1 provides a schematic plan view of a memory cell structure 1000, according to an embodiment of the present invention. As shown in the figure, drain terminal extension 110 and source terminal extension 120 are disposed on either side of gate terminal 130. Gate terminal 130 can be disposed above or on the sides as well as above fin elements 160. RRAM elements 200 are disposed within the boundary of gate terminal 130. The RRAM elements can be disposed in contact with any otherwise inactive portion of the gate terminal 130. Power rails 150, are disposed in contact with the RRAM stacks 200. Power rails 150 can includes self-aligning contacts. As shown in the figure, the addition of the RRAM elements 200 to the transistor does not increase the die area required for the 1T2R structure beyond the area required for the transistor itself. The top dielectric isolation layers of the structure are not shown in the figure.

Figure 2:
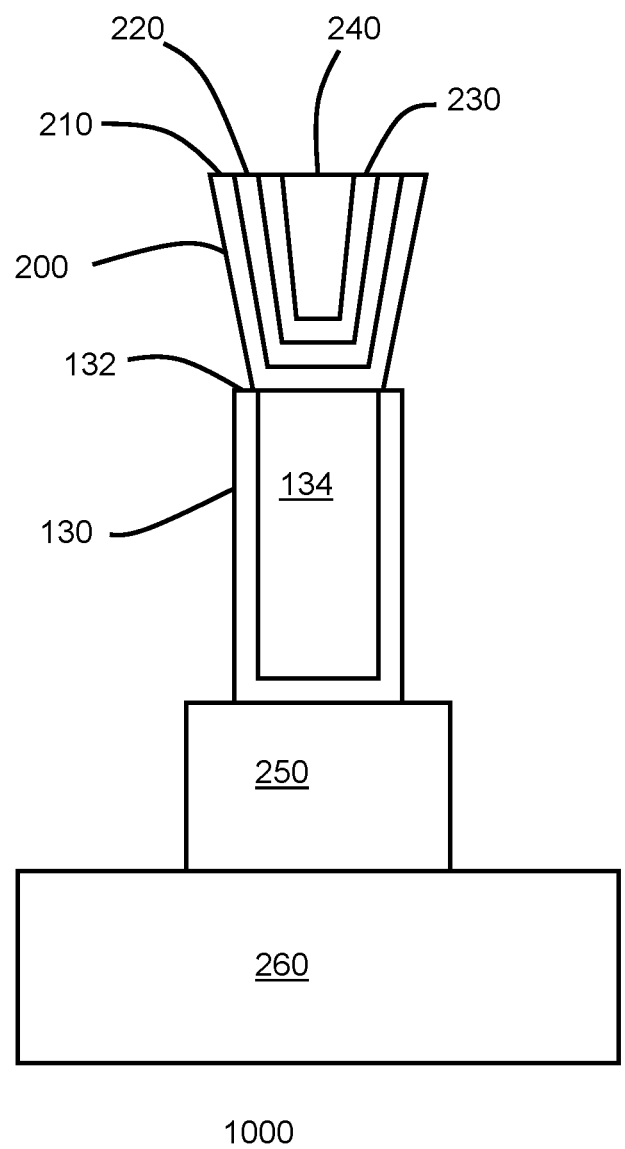
FIG. 2 provides a cross-sectional illustration of a memory cell structure, according to an embodiment of the invention along section line 2-2 of FIG. 1.

FIG. 2 provides a sectional view of memory cell structure 1000 showing the RRAM stack structures 200 disposed in contact with the gate metal 134 of the HK/MG stack of the transistor gate terminal 130. The RRAM stack structures 200 may also contact the gate dielectric portion 132 of the HK/MG stack of the gate terminal 130. The RRAM stack structures 200 can be disposed in contact with any otherwise inactive portion of the gate terminal 130. Switching layer 210 is disposed in contact with the surface of the gate terminal 130. Top electrode 220 is disposed in contact with the switching layer 210. Optional barrier layer 230 is disposed in contact with the top electrode 220. Low-resistance film layer 240 is disposed adjacent to the optional barrier layer 230. Power rail 150 from FIG. 1 is not shown in FIG. 2. Gate terminal 130 is disposed above the transistor channel element 250. The channel element 250 is disposed upon the base substrate 260. In an embodiment, the transistor channel can comprise a series of fins rising from the base substrate. Additional layered structures may be built upon the 1T2R memory cell structure of the figure.

Figure 3:
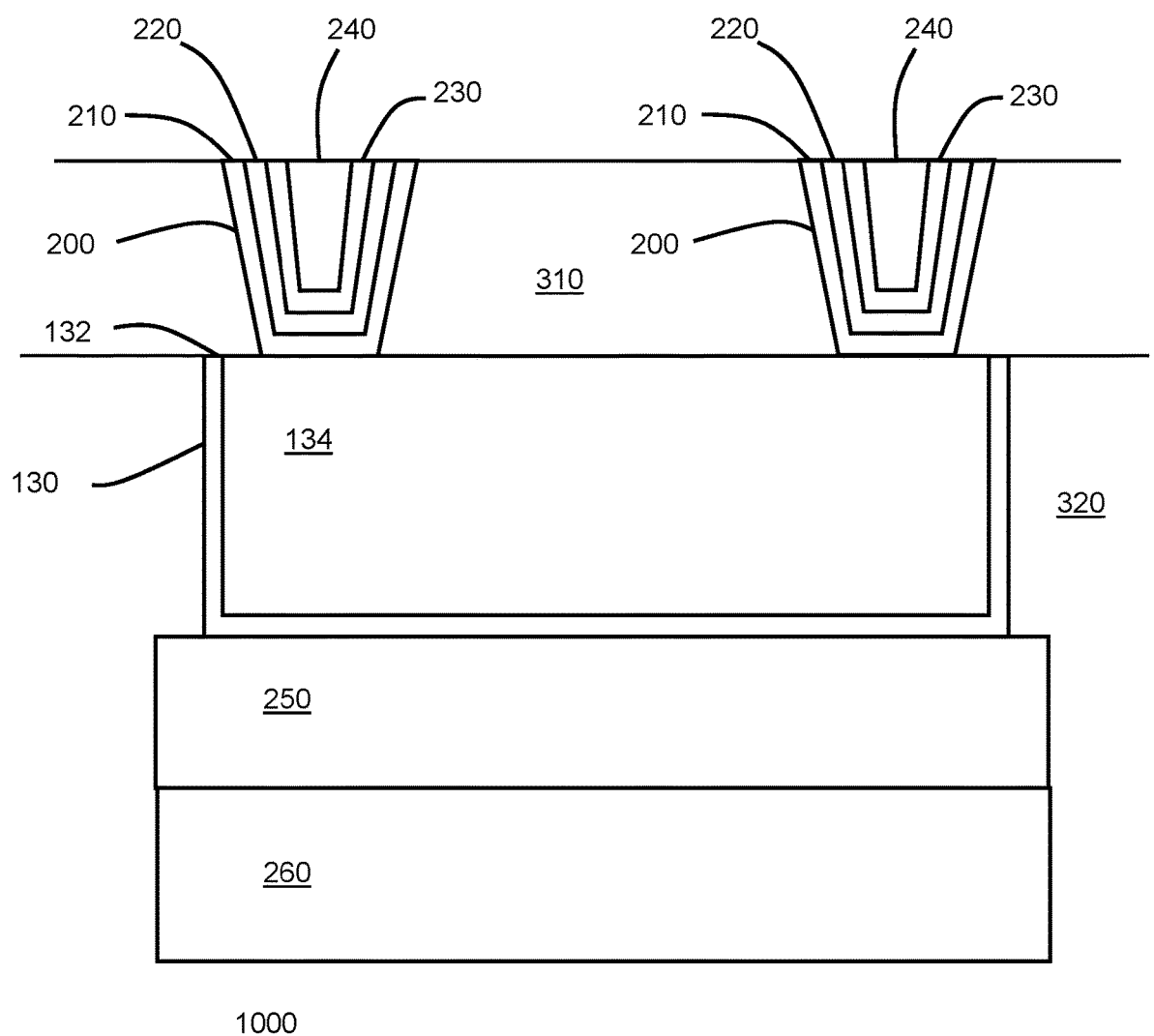
FIG. 3 provides a sectional view of a memory cell structure, according to an embodiment of the invention, along section line 3-3 of FIG. 1.

FIG. 3 provides a sectional view of memory cell structure 100, along line 3-3 of FIG. 1. As provided in the figure, each RRAM stack 200 is disposed in contact with the gate metal 134, of the HK/MG stack of the transistor gate terminal 130. The RRAM stack structures 200 may also contact the gate dielectric portion 132 of the HK/MG stack of the gate terminal 130. The RRAM stacks are formed in vias formed in dielectric isolation layer 310, which is formed above isolation layer 320 and the transistor gate terminal 130. The RRAM stack structures can be disposed in contact with any otherwise inactive portion of the gate terminal 130. Switching layer 210 is disposed in contact with the surface of the gate terminal 130. Top electrode 220 is disposed in contact with the switching layer 210. Optional barrier layer 230 is disposed in contact with the top electrode 220. Low-resistance film layer 240 is disposed adjacent to the optional barrier layer 230.

Figure 4:
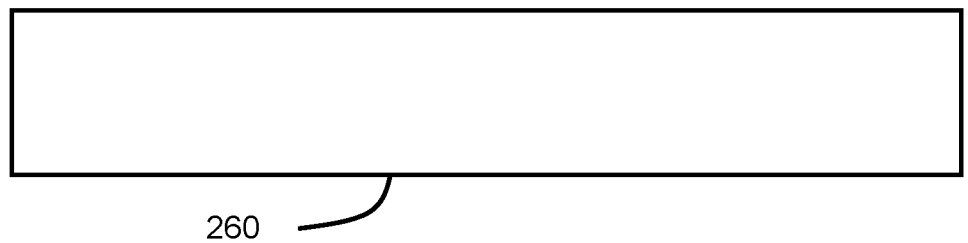
FIGS. 4 through 10 are a series of cross-sectional views illustrating a method of forming a semiconductor structure, according to an embodiment of the invention.

Referring now to FIG. 4, the multilayer RRAM structures may be fabricated using known complementary metal oxide semiconductor (CMOS) manufacturing methods. The structure of the invention can be adapted to horizontal or vertical transistors. In the illustrated embodiment, a horizontal transistor is formed on a semiconductor substrate 260. The substrate 260 includes one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. In an exemplary embodiment, the substrate 260 includes germanium so that the channel region has both electron and hole mobility properties.

Figure 5:
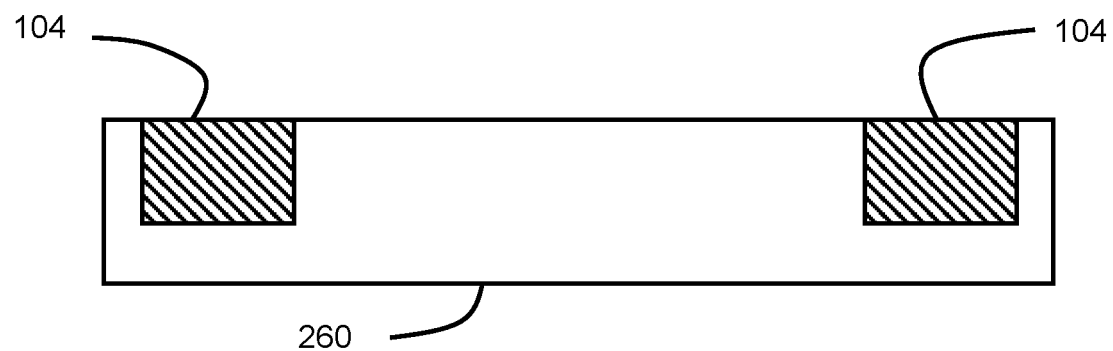

In general, the semiconductor material of the semiconductor substrate 260 may be appropriately doped either with p-type dopant atoms or with n-type dopant atoms. The dopant concentration of the semiconductor substrate may range from about $1.0 \times 10^{15}$ atoms/cm$^3$ to about $1.0 \times 10^{19}$ atoms/cm$^3$, and more specifically from about $1.0 \times 10^{16}$ atoms/cm$^3$ to about $3.0 \times 10^{18}$ atoms/cm$^3$, although lesser and greater dopant concentrations are contemplated herein also. In addition, the semiconductor substrate may be a bulk substrate, a semiconductor-on-insulator or silicon-on-insulator (SOI) substrate, or a hybrid substrate. As illustrated in FIG. 5, isolation structures, such as shallow trench isolation (STI) structures 104, may be formed in the substrate 260. The STI structures 104, can include a dielectric material such as silicon oxide or silicon nitride, and are formed by methods well known in the art.

Figure 6:
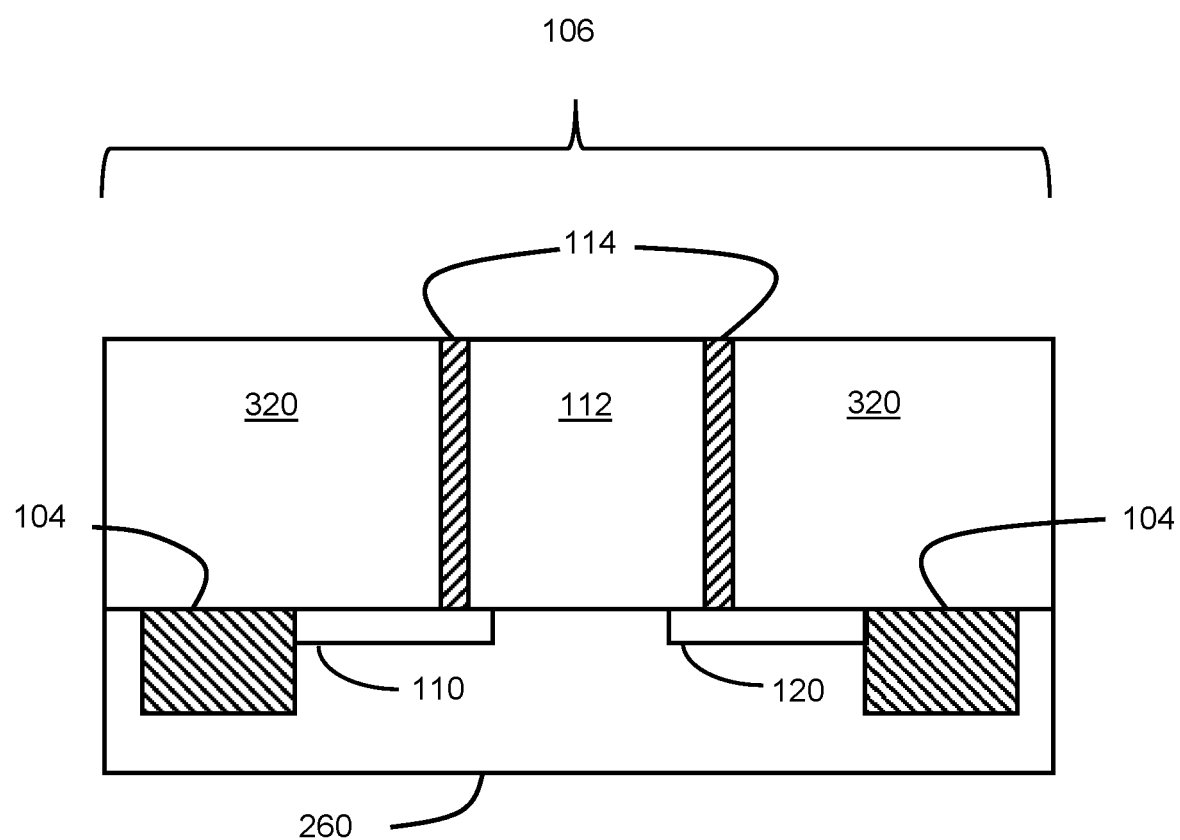

As shown in FIG. 6, the device 106, includes source and drain extension regions 110 formed by ion implantation with a dummy gate structure 112 in place. The source and drain extension regions 110 have a doping of the opposite conductivity type of the doping of the substrate. For example, if the substrate has a p-type doping, the source and drain extension regions have an n-type doping, and vice versa. Source and drain regions are formed, for example, by ion implantation of the same conductivity type as the extension regions. The source and drain regions are implanted with the dummy gate structure 112 and sidewall spacers 114 in place. The sidewall spacers 114 are formed, for example, by deposition of a conformal dielectric material layer (e.g., and oxygen-impermeable material such as silicon nitride) followed by an anisotropic ion etching. The portions of the dielectric material layer that are formed directly on the sidewalls of the dummy gate structure 112, remain after the anisotropic etch to constitute the sidewall spacers 114.

Prior to removal of the dummy gate structure, a first interlevel dielectric (ILD1) layer 320, is formed over top surfaces the device 106. ILD1 layer 320, includes a dielectric material such as silicon oxide, silicon nitride, silicon oxynitride, or a combination thereof. Alternatively, ILD1 layer 320, may include a low-k dielectric material having a dielectric constant less than 3.9 (e.g., the dielectric constant of silicon oxide), and more specifically less than 2.5. Exemplary low-k dielectric materials include organosilicate glass (OSG) and SiLK®. ILD1 layer 320, is planarized to expose a top surface of the dummy gate structure 112.

Figure 7:
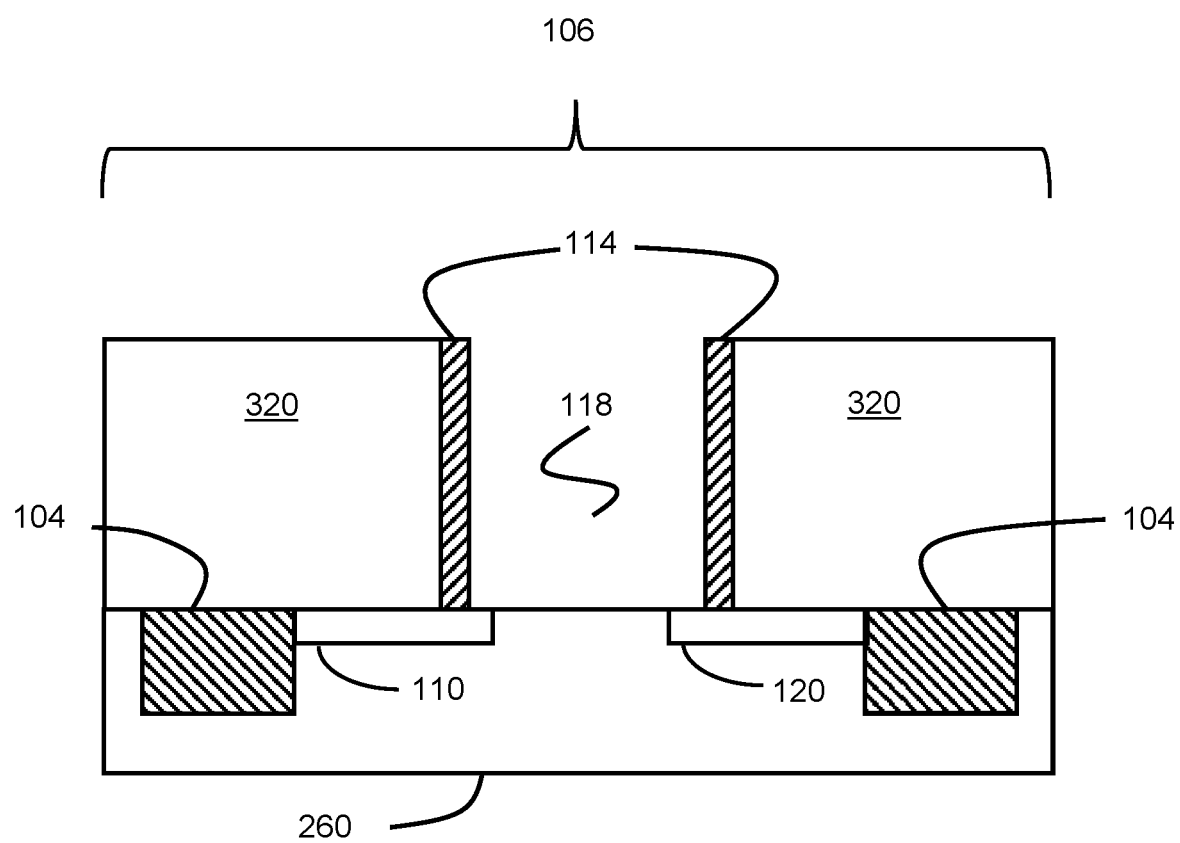

Referring to FIG. 7, in accordance with a replacement gate process, the dummy gate structure 112, is removed, such as through one or more etch processes, so as to form a recess, or gate trench 118, that exposes a top surface of the substrate 260 corresponding to the location of the FET channel.

Figure 8:
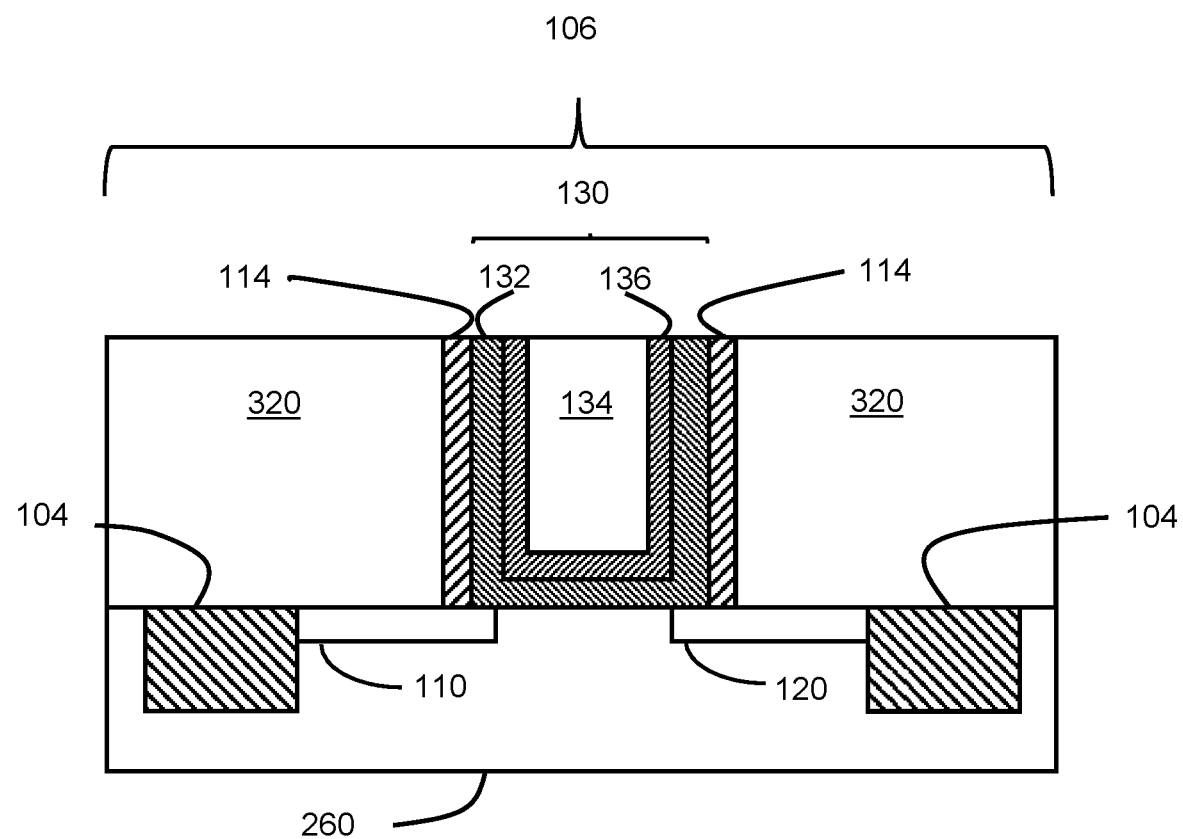

Referring to FIG. 8, a gate terminal stack 130, is disposed in the gate trench 118. In an embodiment, the gate stack includes a gate dielectric material 132, a work function metal 136, and a gate metal 134. The gate dielectric material(s) 132, can be a dielectric material having a dielectric constant greater than 3.9, 7.0, or 10.0. Non-limiting examples of suitable materials for the gate dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 132 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 132 may vary depending on the deposition process as well as the composition and number of high-k dielectric materials used.

The work function metal(s) 136, may be disposed over the gate dielectric material 132. The type of work function metal(s) 136, depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 136 may be deposited by a suitable deposition process, for example, CVD, PECVD, PVD, plating, thermal or e-beam evaporation, and sputtering.

The gate metal 134 is a conductive gate metal that is deposited over the gate dielectric material(s) 132, and work function metal(s) 136, to form the gate terminal stack 130. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal material.

Figure 9:
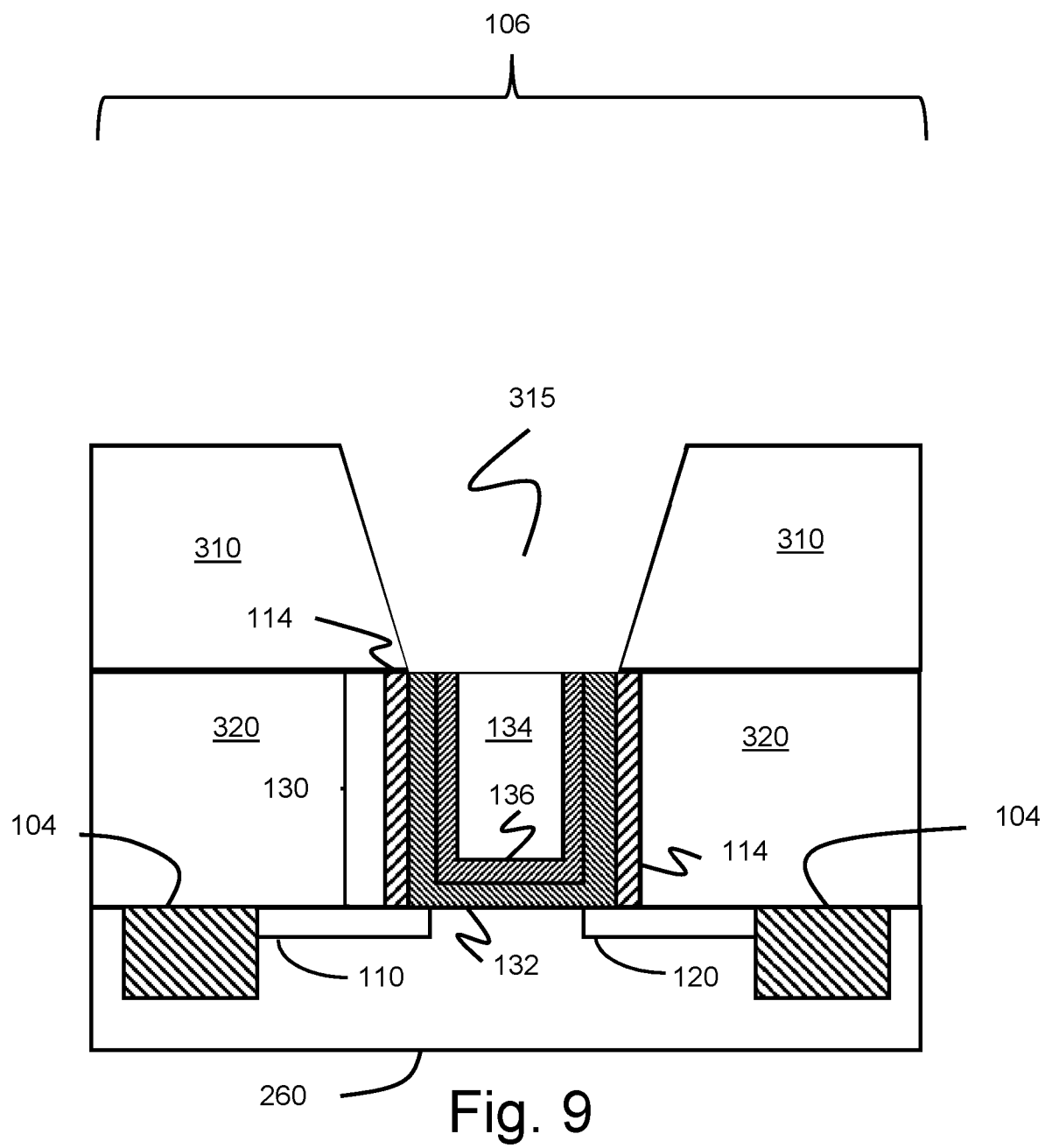

Referring to FIG. 9, a second interlevel dielectric (ILD2) layer 310, is disposed above ILD1 and the gate terminal stack 130. RRAM vias 315, are created in ILD2 310. To remove the ILD2 material and form the RRAM vias 315, a resist, such as a photoresist, may be deposited and patterned. An etch process, such as a RIE, may be performed using the patterned resist as an etch mask to remove the ILD material until the gate terminal stack 130 is exposed.

Figure 10:
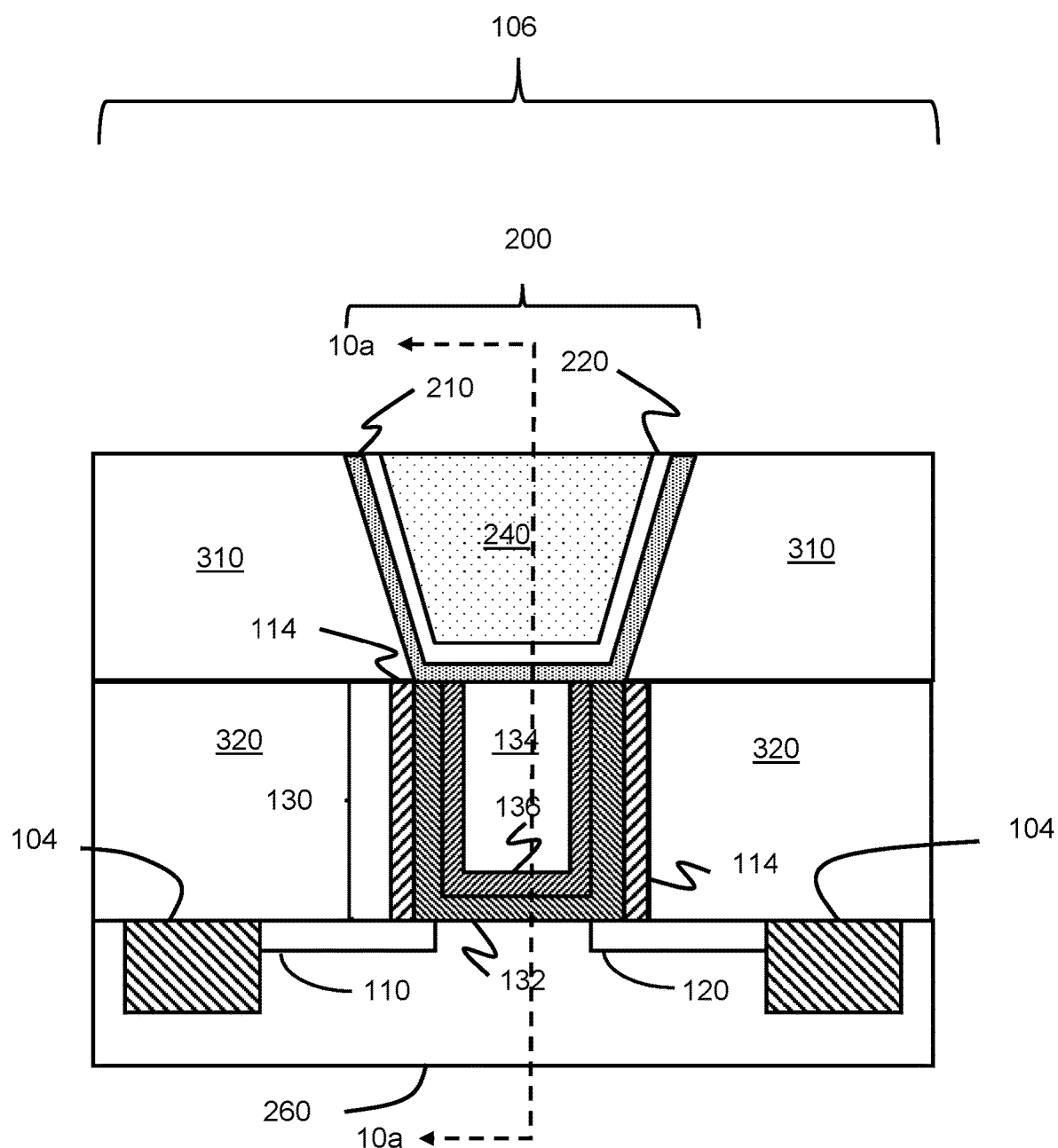

Referring to FIG. 10, RRAM element stacks 200, are then disposed in the RRAM vias 315. A first switching layer 210, such as a metal oxide layer (e.g., $HfO_x$, $TiO_x$, or $TaO_x$), is deposited forming a film in contact with the perimeter of the RRAM vias 315, including in contact with the upper surface of the gate terminal stack 130 terminal at the bottom of each RRAM via 315. The first switching layer 210, is deposited by a deposition process, for example, chemical vapor deposition (CVD) or physical vapor deposition (PVD). A top electrode layer 220, such as TiN, or TiAlC/TiN alloy, is deposited as a film over first switching layer 210. The top electrode layer 220, may be deposited by a suitable deposition process, for example, CVD, PECVD, PVD, plating, thermal or e-beam evaporation, and sputtering. A low-resistance film layer 240, such as W, Cu, Ag, or Au, is subsequently deposited over the top electrode layer 220. The low resistance film layer 240, may be deposited by a suitable deposition process, for example, CVD, PECVD, PVD, plating, thermal or e-beam evaporation, and sputtering. Planarization of the completed structure, for example, chemical mechanical planarization (CMP), removes the three film layers from the surface of ILD2 layer 310, leaving the RRAM element stacks 200, in the RRAM vias 315.

Figure 10A:
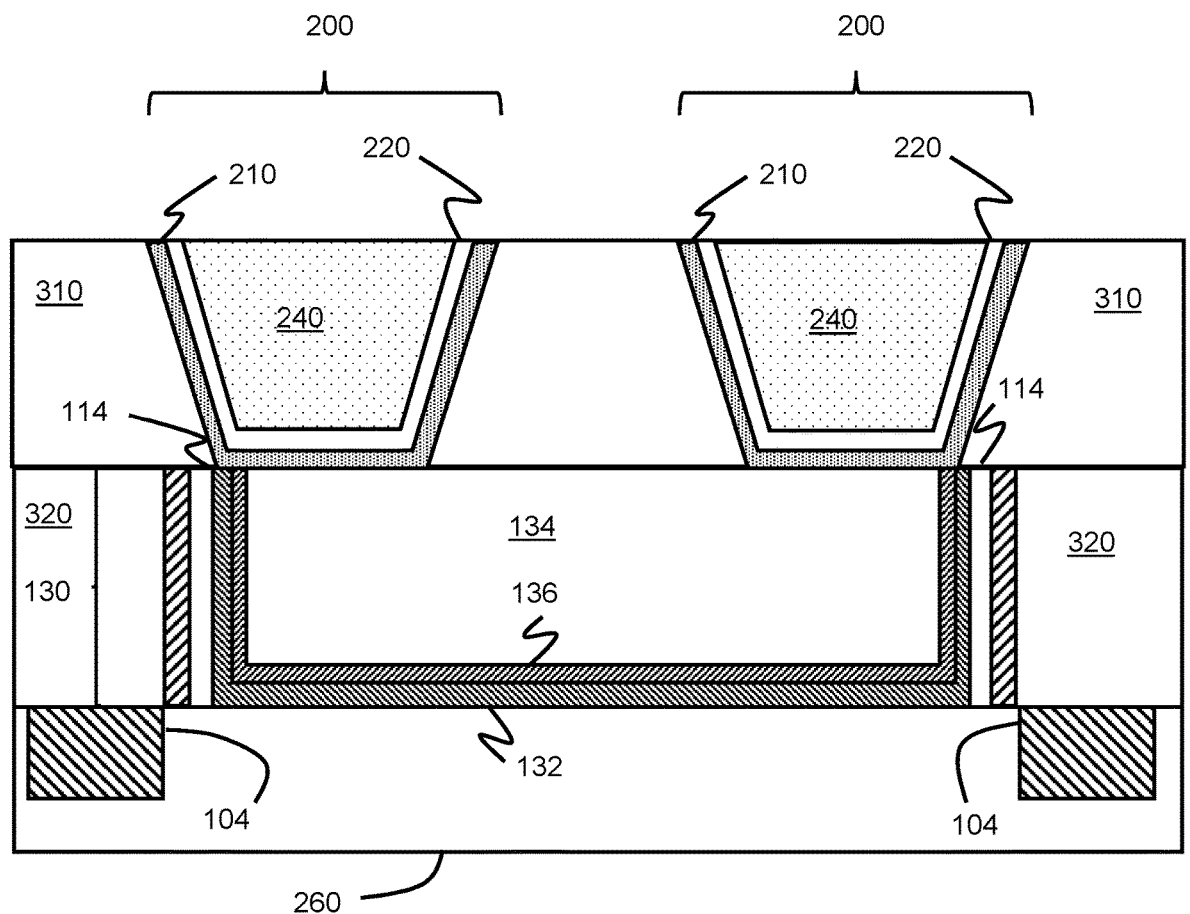

FIG. 10a provides a cross-sectional view of the semiconductor structure of FIG. 10, along section line 10a-10a.

Figure 11:
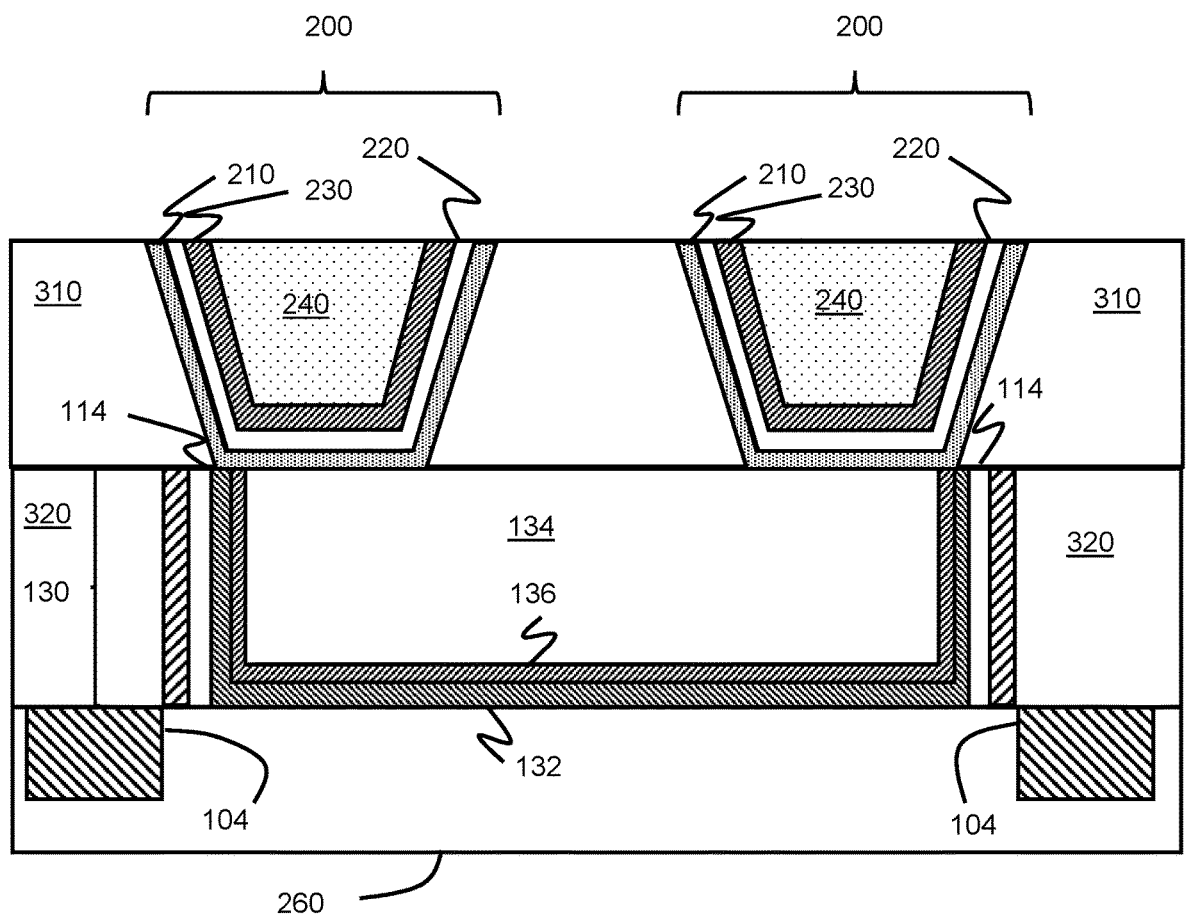
FIG. 11 shows a cross-sectional view of a semiconductor structure including an RRAM stack, according to an embodiment of the invention.

Referring to FIG. 11, in an embodiment, a barrier layer 230, such as TaN may deposited between the top electrode layer 220, and the low-resistance film layer 240. The barrier layer 230, may be deposited by a suitable deposition process, for example, CVD, PECVD, PVD, plating, thermal or e-beam evaporation, and sputtering, prior to the deposition of low resistance film layer 240.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the Figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A resistive random-access memory (RRAM) cell structure, the RRAM cell comprising:
    a pass transistor having first and second source/drain terminals, and a gate terminal; and
    an isolation layer disposed upon the gate terminal, the isolation layer comprising a first via and a second via, each via defined by a perimeter extending from a top surface of the isolation layer to a bottom surface of the isolation layer, each perimeter exposing a portion of the gate terminal:
        a first RRAM element stack; and
        a second RRAM element stack;
        wherein each of the first and second RRAM element stacks comprise a bottom electrode, a switching layer, a top electrode and a low-resistance film, the gate terminal comprising the bottom electrode; and
        wherein the switching layer, top electrode and low resistance film of the first and second RRAM element stacks are disposed in the first and second vias.

2. The RRAM cell structure according to claim 1, wherein the first and second RRAM element stacks further comprise a barrier layer disposed between the top electrode and the low resistance film.

3. The RRAM cell structure according to claim 1, wherein the first RRAM element stack and the second RRAM element stack each comprise an anode and a cathode, the anode of the first RRAM element stack and the anode of the second RRAM element stack, each connect to the gate terminal of the transistor.

4. The RRAM cell structure according to claim 1, wherein the RRAM cell structure forms a portion of a field programmable gate array structure.

5. The RRAM cell structure according to claim 1, further comprising a first power rail connected to the first RRAM element stack, and a second power rail connected to the second RRAM element stack.

6. The RRAM cell structure according to claim 1, wherein the gate comprises a high-k dielectric, metal gate stack.

7. The RRAM cell structure according to claim 1, further comprising:
    a barrier layer disposed between the top electrode and the low resistance film;
    a first power rail connected to the first RRAM element stack; and
    a second power rail connected to the second RRAM element stack;
    wherein the RRAM cell structure forms a portion of a field programmable gate array structure.

8. An integrated circuit including an RRAM cell structure comprising:
    a first RRAM element stack;
    a second RRAM element stack;
    a pass transistor having first and second source/drain terminals, and a gate terminal; and
    an isolation layer disposed upon the gate, the isolation layer comprising at least two vias, each via defined by a perimeter extending from a top surface of the isolation layer to a bottom surface of the isolation layer, each perimeter exposing a portion of the gate terminal;
    wherein the first and second RRAM element stacks comprise a bottom electrode, a switching layer, a top electrode and a low-resistance film,
    wherein the gate terminal comprises the bottom electrode,
    wherein the switching layer, top electrode and low resistance film are disposed in the vias.

9. The integrated circuit according to claim 8, wherein the first and second RRAM element stacks further comprise a barrier layer disposed between the top electrode and the low resistance film.

10. The integrated circuit according to claim 8, wherein the first RRAM element stack and the second RRAM element stack each comprise an anode and a cathode, the anode of the first RRAM element stack and the anode of the second RRAM element stack, each connect to the gate terminal of the transistor.

11. The integrated circuit according to claim 8, wherein the RRAM cell structure forms a portion of a field programmable gate array structure.

12. The integrated circuit according to claim 8, the RRAM cell structure further comprising a first power rail connected to the first RRAM element stack, and a second power rail connected to the second RRAM element stack.

13. The integrated circuit according to claim 8, wherein the gate comprises a high-k dielectric, metal gate stack.

14. The integrated circuit according to claim 8, the RRAM cell structure further comprising:
    a barrier layer disposed between the top electrode and the low resistance film;
    a first power rail connected to the first RRAM element stack; and
    a second power rail connected to the second RRAM element stack;
    wherein the RRAM cell structure forms a portion of a field programmable gate array structure.

* * * * *